US009779558B2

(12) United States Patent
Correa et al.

(10) Patent No.: US 9,779,558 B2
(45) Date of Patent: Oct. 3, 2017

(54) CALIBRATION TOOL ASSEMBLY AND METHOD OF USING SAME

(71) Applicants: Colt Correa, Shelby Township, MI (US); Dhanasekaran Venugopal, Troy, MI (US); David Robins, Birmingham, MI (US)

(72) Inventors: Colt Correa, Shelby Township, MI (US); Dhanasekaran Venugopal, Troy, MI (US); David Robins, Birmingham, MI (US)

(73) Assignee: Intrepid Control Systems, Inc., Madison Heights, MI (US)

( * ) Notice: Subject to any disclaimer, the term of this patent is extended or adjusted under 35 U.S.C. 154(b) by 17 days.

(21) Appl. No.: 14/960,951

(22) Filed: Dec. 7, 2015

(65) Prior Publication Data

US 2017/0161970 A1 Jun. 8, 2017

(51) Int. Cl.
*G07C 5/08* (2006.01)
*G01R 31/317* (2006.01)
*G01R 31/00* (2006.01)

(52) U.S. Cl.
CPC ......... *G07C 5/08* (2013.01); *G01R 31/31705* (2013.01); *G01R 31/31723* (2013.01)

(58) Field of Classification Search
CPC .... B60R 16/023; G07C 5/08; G01R 31/31705
USPC ............................ 701/33.1, 31.4, 31.5, 33.2
See application file for complete search history.

(56) References Cited

U.S. PATENT DOCUMENTS 7,778,750 B2 * 8/2010 Knight ................ B60R 16/0315 701/31.5
2008/0269975 A1 * 10/2008 Bertosa ................. G07C 5/008 701/31.4
2014/0277922 A1 * 9/2014 Chinnadurai ........ G07C 5/0808 701/33.2
2016/0031389 A1 * 2/2016 Grimm ................. B60R 16/023 701/33.1

* cited by examiner

*Primary Examiner* — Tan Q Nguyen
(74) *Attorney, Agent, or Firm* — Simonelli IP, PLLC

(57) ABSTRACT

A calibration tool assembly is operatively connected to a control unit of a vehicle. The calibration tool assembly includes a plug on device (POD) that is electrically connected to the control unit of the vehicle. The POD includes a field programmable gate array (FPGA) and a debugger port, which is controlled by the FPGA. The POD is operatively connected to the control unit of the vehicle. The debugger port bidirectionally transmits instructions between the FPGA and the control unit for the vehicle to debug and send instructions to the control unit. The calibration tool assembly also includes a hub, which is removably connected to the FPGA. The hub receives all measurement variable data from the control unit through the FPGA for analysis.

14 Claims, 7 Drawing Sheets

CALIBRATION TOOL ASSEMBLY AND METHOD OF USING SAME

BACKGROUND ART

1. Field of the Invention

The invention relates to plug on devices used to bidirectionally communicate with a control unit of a vehicle. More particularly, the invention relates to a calibration tool assembly that is capable of measuring all measurement variables from a control unit of a vehicle in real time to identify opportunities to enhance performance, and to identify and debug issues.

2. Description of the Related Art

Modern electronic control units (ECUs) include engine electronic control units and transmission electronic control units, and will hereinafter be referred to as ECUs. ECUs are highly complex systems that implement a plurality of real-time control algorithms within a single microcontroller. To aid in the development and testing of these real-time control algorithms, it is sometimes necessary to connect a Plug On Device (POD) to a microcontroller debug interface, which provides real-time access to the microcontrollers memory. Developers are able to perform high speed data acquisition (DAQ) to observe the control algorithms, high speed data stimulation (STIM) to replace algorithm outputs partly or even completely with outputs of different algorithms that are calculated on an external high-speed system (called bypassing), or to calibrate control algorithm parameters (CAL) while the systems being operated by the ECU is running.

PODS are connected to a single or multiple microcontroller debug interfaces to access the memory of the microcontroller asynchronously. In most cases, it is therefore necessary to integrate a small piece of service code into the ECU software that ensures data consistency and time alignment when performing DAQ and STIM, as well as providing additional features for parameter calibration and bypass status detection.

SUMMARY OF THE INVENTION

A calibration tool assembly is operatively connected to a control unit of a vehicle. The calibration tool assembly includes a POD that is electrically connected to the control unit of the vehicle. The POD includes a field programmable gate array (FPGA) and a debugger port controlled by the FPGA. The POD is operatively connected to the control unit of the vehicle. The debugger port bidirectionally transmits instructions between the FPGA and the control unit for the vehicle to debug and send instructions to the control unit. The calibration tool assembly also includes a hub, which is removably connected to the FPGA for receiving all measurement variable data from the control unit through the FPGA for analysis.

BRIEF DESCRIPTION OF THE DRAWINGS

Advantages of the invention will be readily appreciated as the same becomes better understood by reference to the following detailed description when considered in connection with the accompanying drawings, wherein.

DETAILED DESCRIPTION OF THE PREFERRED EMBODIMENT

Figure 1:
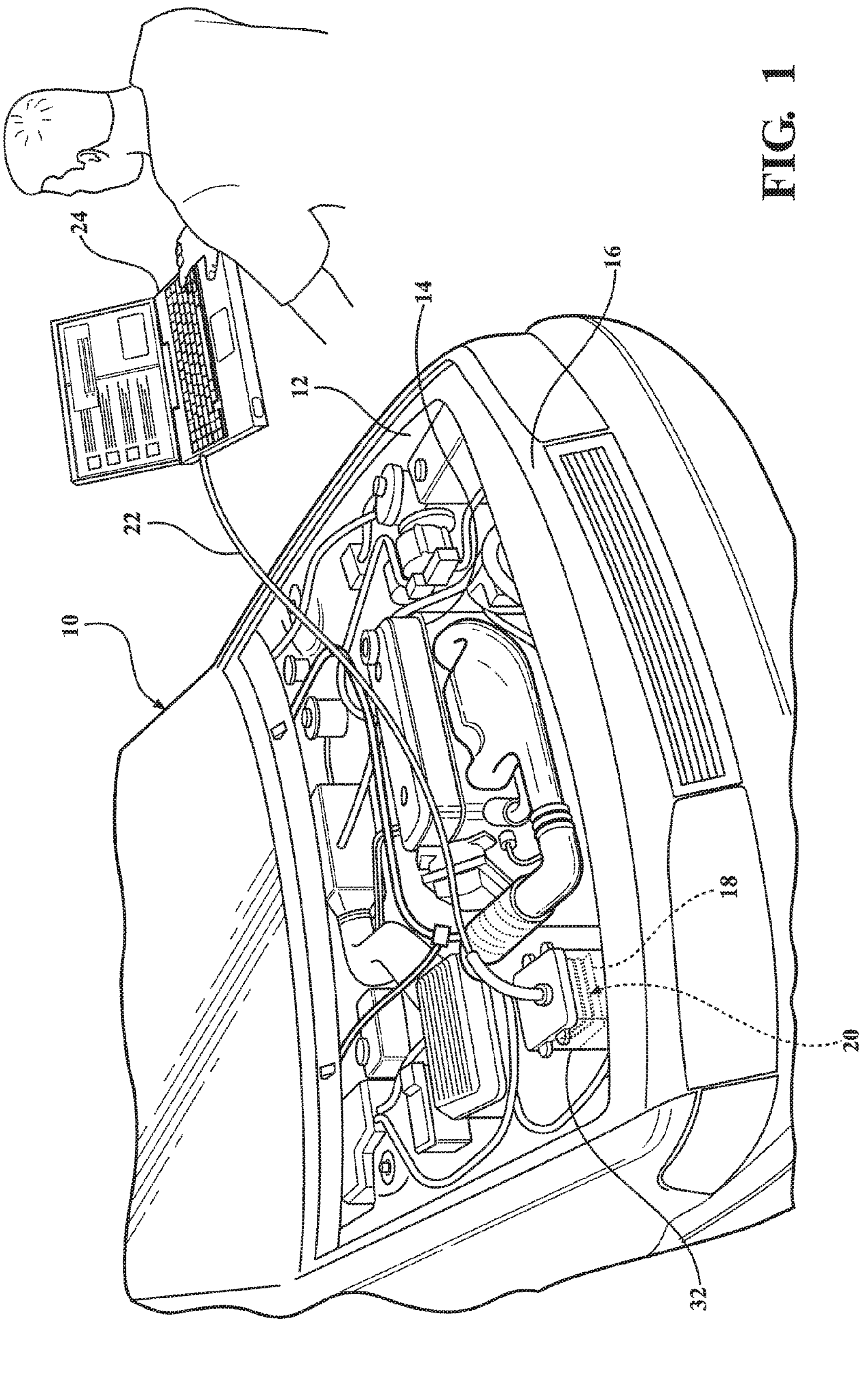
FIG. 1 is a perspective view, partially cutaway, of a vehicle with a hood removed showing the engine compartment with a computing device operatively connected to the engine control unit.

Referring to FIG. 1, a vehicle 10 is shown partially cut away with the hood removed for purposes of simplicity. The vehicle 10 includes an engine compartment 12 housing and engine 14. It should be appreciated by those skilled in the art that the engine 14 may be an internal combustion engine 14 or any other type of device that is able to control some aspect of the vehicle 10 and/or propel the vehicle 10. Also, while the engine compartment 12 is shown to be disposed adjacent a front end 16 of the vehicle 10, it should be appreciated that the engine compartment 12 may exist toward the middle or in the rear of the vehicle 12.

The engine 14 drives a transmission (not shown). Both the engine 14 and the transmission are electronically controlled. An electronic control unit (ECU) 18 is shown to control the operation of the engine 14. The invention relates to the ECU and it may be used in conjunction with any ECU, whether it is the engine ECU 18, the transmission ECU, a motor ECU, a batter ECU, or any other ECU.

Figure 2:
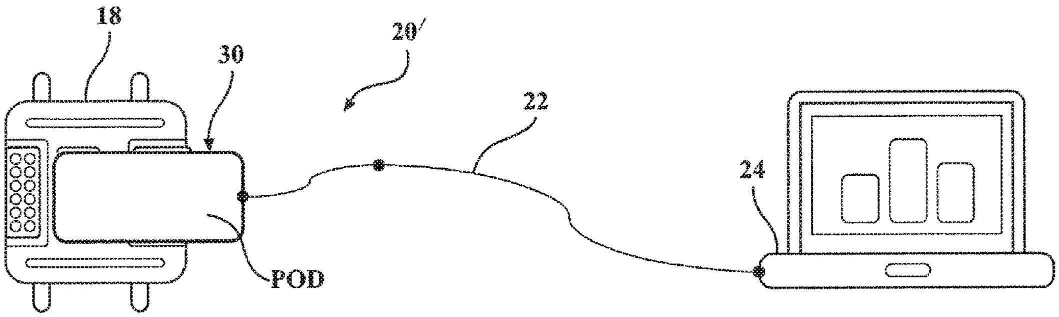
FIG. 2 is an alternative embodiment of the invention shown connected to a computer.
Figure 3:
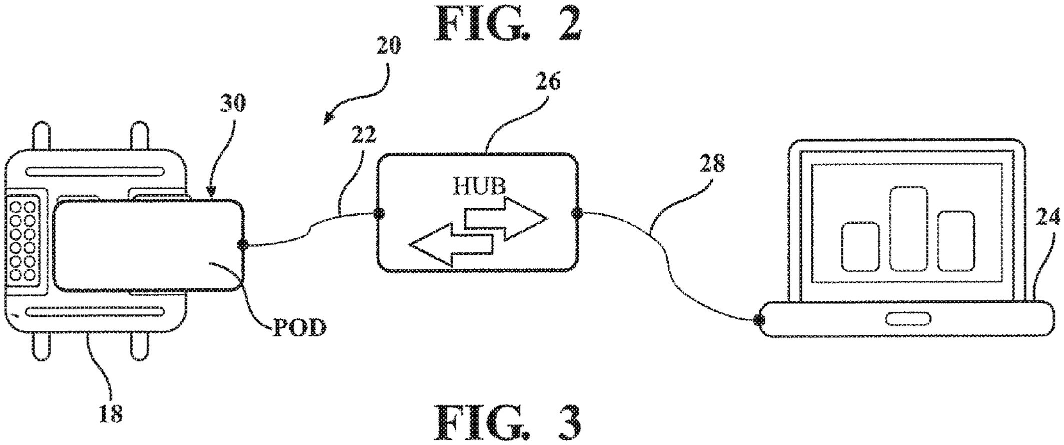
FIG. 3 is one embodiment of the invention shown connected to a computer.
Figure 4:
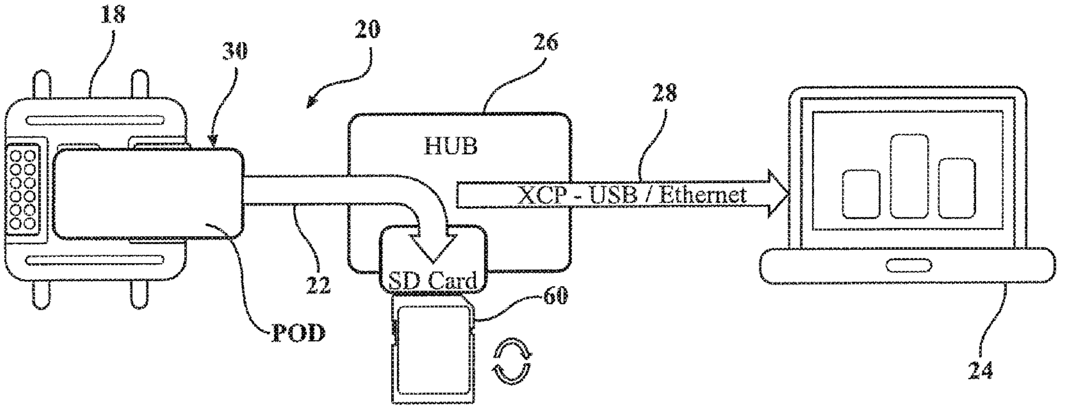
FIG. 4 is a preferred embodiment of the invention connected to a computer.

A calibration tool assembly is generally indicated at 20 in the Figures. The calibration tool assembly 20 is operatively connected to the ECU 18 of the vehicle 10. The calibration tool assembly 20 allows data to be collected from the ECU 18 and transmitted across a data line 22 to be analyzed by a computing device 24. In FIG. 1, the computing device is a laptop computer 24. It should be appreciated by those skilled in the art that the computing device 24 may be any device capable of receiving, analyzing and/or displaying data. The configuration of the calibration tool assembly 20 in FIG. 1 is similar to that which is shown in FIG. 2 with the vehicle 10 in the engine 14 removed from the Figure.

In one embodiment, the type of data that is copied and transmitted from the ECU 18 through the calibration tool assembly 20 includes all measurement variables. Measurement variables are defined as the set of all software RAM variables that have the possibility of being used to test, verify or improve the real-time control algorithms or control software in the control unit. These measurement variables are often listed and described in an industry standard ECU description file. The most common of this standard file tiyp is an Association for Standardization of Automation and Measuring Systems, herein after referred to as ASAM, ASAM MCD-2 file. The data that is created in the software stack are not copied and transmitted through the calibration tool assembly 20. It is contemplated that the software stack data may be collected should it be desired. By the calibration tool assembly 20 being able to collect data associated with all measurement variables, the need to preselect which variables are to be tagged for data collection does not have to occur. This provides greater value to the data collection process because not all events are repeatable and if something occurs to a measurement variable that was not selected, a whole test or group of tests may need to be repeated, with no guarantee that the repeated test(s) will produce the event of interest. As such, any event can be analyzed using the data collected by the calibration tool assembly 20, whether the event was the subject of the test or not.

The calibration tool assembly 20 also includes a hub 26, best seen in FIGS. 3, 4, 8 and 9. The hub 26 is removably connected to the calibration tool assembly 20 to receive data from the calibration tool assembly 20. The hub 26 then transmits the data along a second data line 28 to the computing device 24.

Figure 5:
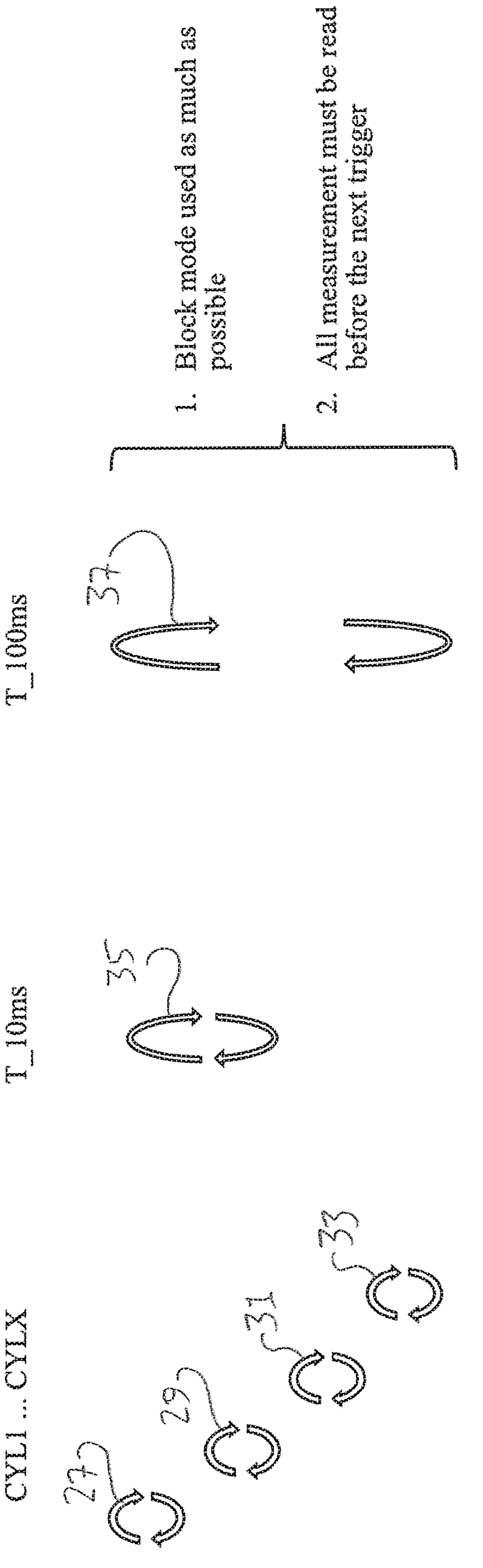
FIG. 5 is an example graphic representation of the events or tasks that exist inside an ECU.

FIG. 5 is a graphic representation of the tasks or cycles in the ECU within which data has the opportunity to change. The arcuate arrow pairs 27, 29, 31, 33, 35, and 37 represent different events or tasks that must be accomplished in a particular time period. By way of example, arrow pairs 27, 29, 31, 33 represent the different cylinders in the internal combustion engine 14. In this example, the internal combustion engine 14 is a four cylinder engine and each cylinder creates an event, which results in the need for a task to measure that event. These events occur rapidly; on the order of 1 millisecond. Other tasks that may need to be measured include altitude, gasoline level, engine temperature, oil pressure, and the like. Not every task needs to be measured at the same rate, so some tasks are measured at rates slower than others. FIG. 5 shows that some tasks will be measured at a rate of once per millisecond. Others will be measured at a rate of once per 10 milliseconds and others at once per every 100 milliseconds. Because some events will occur less often than others, identifying those and creating tasks to measure them less often will save valuable memory space and remove unnecessary data gathering for tasks that do not occur as often as others. In another effort to increase the efficiency of collecting data, using the method of collecting blocks of data is used as much as possible.

Figure 6:
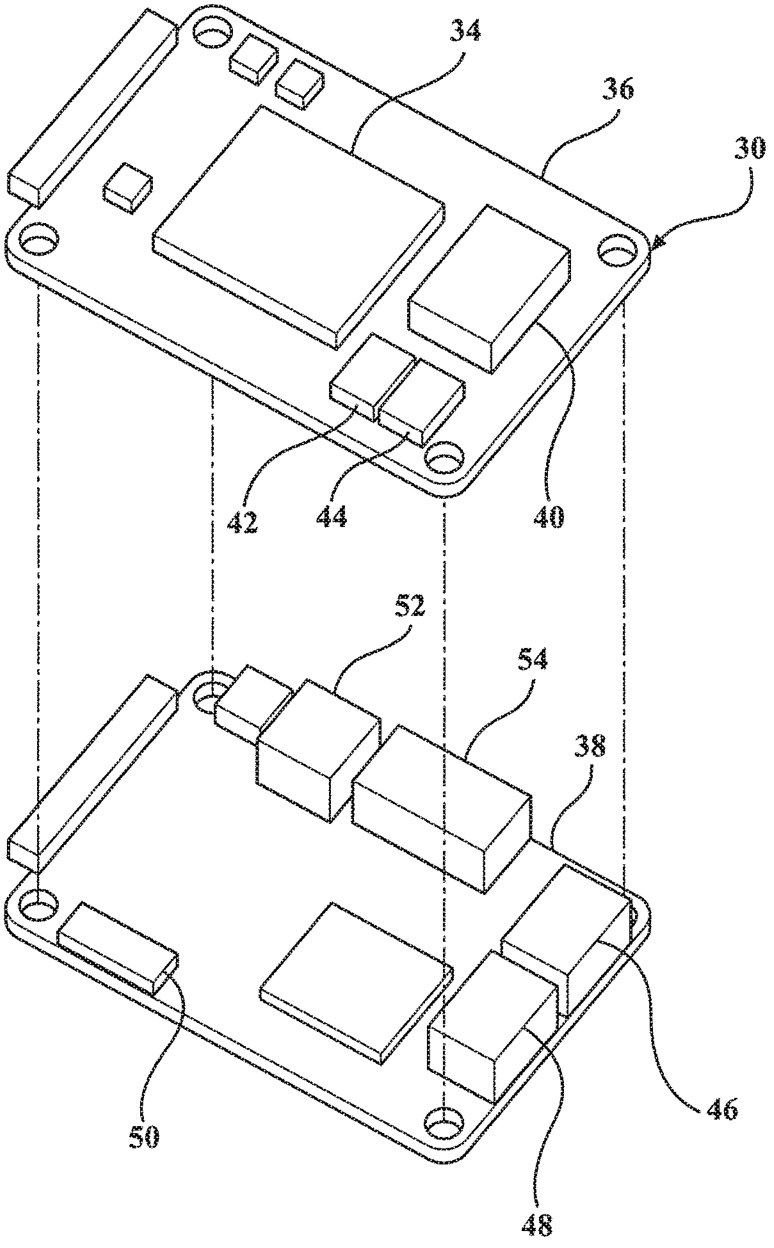
FIG. 6 is an exploded perspective view of the POD.

Referring to FIG. 6, the portion of the calibration tool assembly commonly referred to as a POD 30 is shown. The POD 30 is the portion of the calibration tool assembly 20 that is connected directly to the ECU 18 and is housed within an ECU housing 32 (FIG. 1). The POD 30 includes a field programmable gate array (FPGA) that is operatively connected to the ECU 18 of the vehicle 10. The POD 30 is shown having first 36 and second 38 printed circuit boards stacked one atop the other. These printed circuit boards 36, 38 would be secured together using a standard connecting device (e.g., nuts and screws). It should be appreciated by those skilled in the art that the POD 30 could be fabricated to exist on a single printed circuit board if the space requirements within the ECU housing 32 permitted such a design.

The FPGA 34 is mounted to the first printed circuit board 36. In one embodiment, the FPGA 34 is a Zynq product having a high-speed system clock and four multi-gigabit transceivers. Also affixed to the first printed circuit board 36 are memory devices 40, 42, 44. In one embodiment, the first memory device 40 is a one gigabyte DDR 3 synchronous dynamic random access memory chip. The second 42 and third 44 memory devices are dual QSPI flash memory devices.

The calibration tool assembly 20 also includes a debugger port 46 that is controlled by the FPGA 34 and is operatively connected to the ECU 18 of the vehicle 10. The debugger port 46 bidirectionally transmits instructions between the FPGA 34 and the ECU 18 of the vehicle 10. The debugger port 46 allows the FPGA 34 to debug and send instructions to the ECU 18.

The calibration tool assembly 20 also includes an external communication port 48 allowing the POD 30 to drive data collected from the ECU 18 external from the ECU housing 32 to eventually be received by the computing device 24. In one embodiment, the external communication port 48 is an Ethernet port capable of speeds necessary to drive the vast amount of data out of the ECU 18 to be captured eventually by the computing device 24.

The POD 30 also includes a POD debugging port 50. The POD debugging port 50 allows for communication external of the POD 30 allowing a user to debug the FPGA 34 and any related electronics that are directing a part of the POD 30. In one embodiment, the POD debugging port 50 is a UART.

The POD 30 also includes a primary slower speed debugger interface 52 to enable the bi-directional transfer of data between the calibration tool assembly 20 and the control unit or ECU 18 of the vehicle 10. In one embodiment, the primary slower speed debugger interface 52 is a DAP2, which is a second version of a data access protocol. The primary slower speed debugger interface 52 controls a primary measurement interface 54, which is used to receive data output by the ECU 18 of the vehicle 10 synchronous with calculation rate of the measurement variable data. In one embodiment, the primary measurement interface 54 is an Aurora interface capable of transmitting data at a rate of 2.5 gigabits per second.

Figure 7:
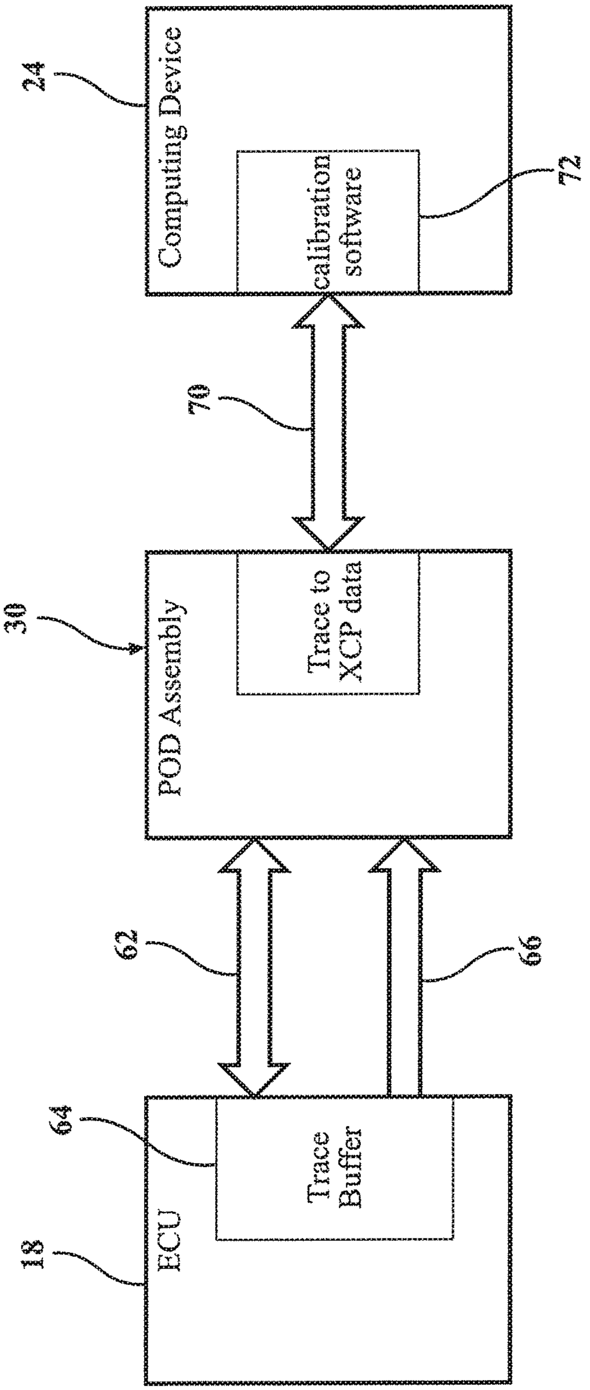
FIGS. 7 through 9 are graphic representations of one embodiment of the invention.

Referring to FIG. 7, a block diagram illustrates the data transfer between the ECU 18, the calibration tool assembly 30 and the computing device 24. Using the primary slower speed debugger interface 52, bidirectional data 62 is transferred between the calibration tool assembly 30 and a trace buffer 64 of the ECU 18. Measurement data 66 is transmitted from the trace buffer 64 of the ECU 18 to the calibration tool assembly 30. That data 66 is then transmitted to the computing device 24 over a line graphically represented at 70. The data transmitted over the data line 70 is in an XCP protocol used to glean the information from the ECU 18. Calibration software 72, resident on the computing device 24 receives and sends the XCP data and converts it to a format that is human readable on the computing device 24.

Figure 8:
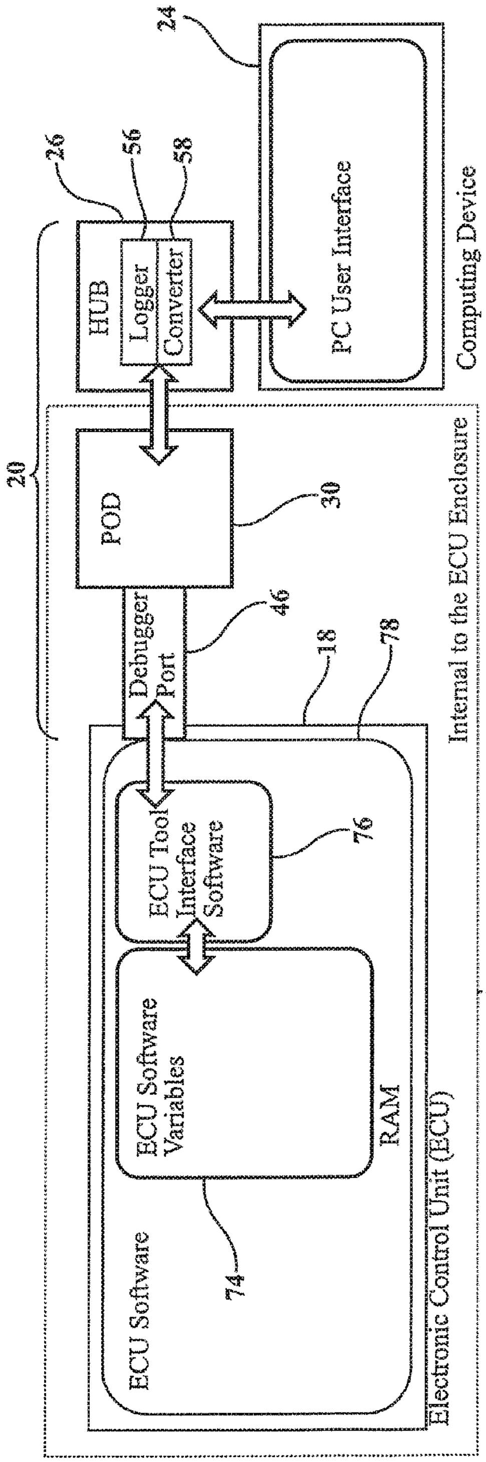
Figure 9:
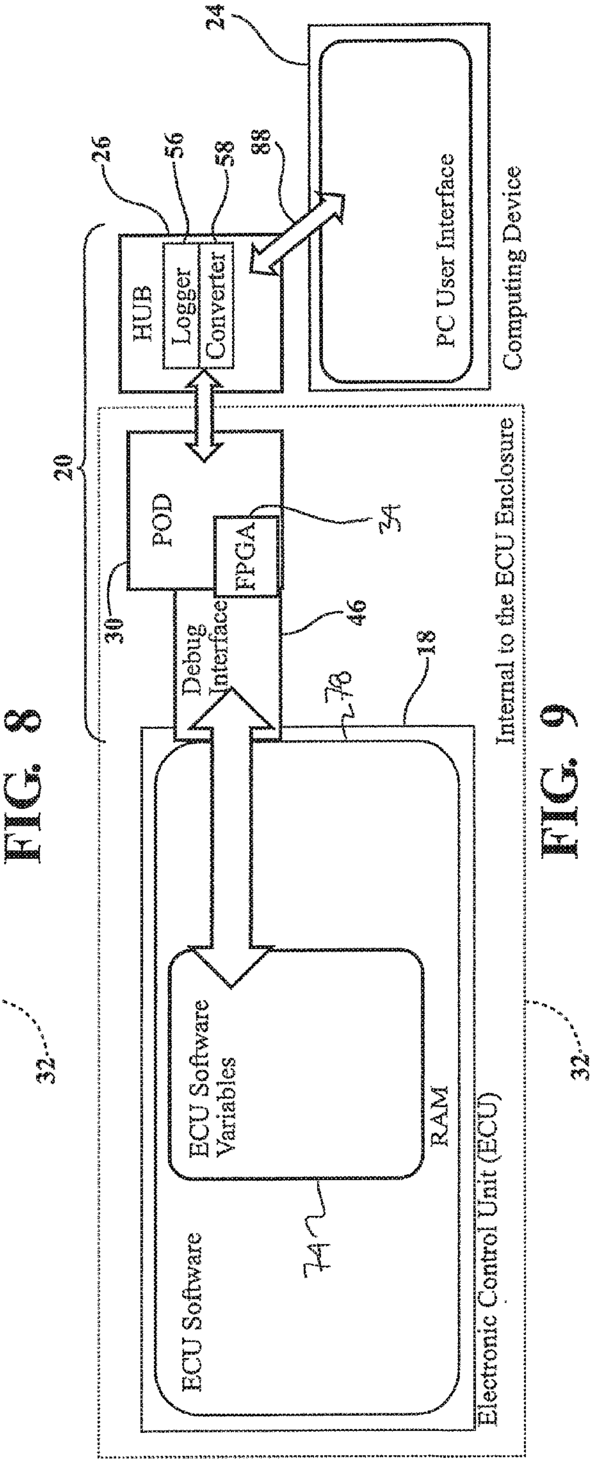

Referring to FIGS. 8 and 9, the hub 26 includes a logging device 56 for logging all data received from the FPGA 34. The hub 26 also includes a converter 58 that converts the data received from the FPGA 34 from a first format to a second format readable by the computing device 24. By way of example, the data received from the FPGA 34 is in compressed binary format and after it passes through the converter 58, it is in a standard XCP format. It should be noted that in the standard XCP format, it may not be possible to transfer all data from the FPGA to the computing device because of limitations in the data communication 88 and the power of the computing device 24.

The hub 26 also includes hub memory 60 (shown in FIG. 4) to store data received by the FPGA 34. The hub memory 60 may be used if the hub 26 is connected to the POD 30 while the vehicle 10 is operating in a real world test situation. The hub memory 60 will allow the data to be stored until hub 26 can be connected to the computing device 24. In one embodiment, the hub memory 60 is selectively removable from the hub 26. In the embodiment shown in FIG. 4, the selectively removable hub memory 60 is an SD Card.

Referring again to FIGS. 8 and 9, a graphic representation of hardware and software is generally shown. In FIG. 8, the ECU 18 is shown having ECU software variables 74 and ECU interface software 76 stored within ECU RAM 78. The debugger port 46 connects between the ECU 18 and the POD 30. A data line allows data to be transferred from the POD 30 to the hub 26, after which the data is transferred to the computing device 24.

In FIG. 9, many of the elements are similar to that of FIG. 8, and a discussion of those will not be repeated. The differences between FIGS. 8 and 9 include the POD 30 having the FPGA 34 and the ECU software 78 lacking the ECU Tool Interface Software 76.

Figure 10:
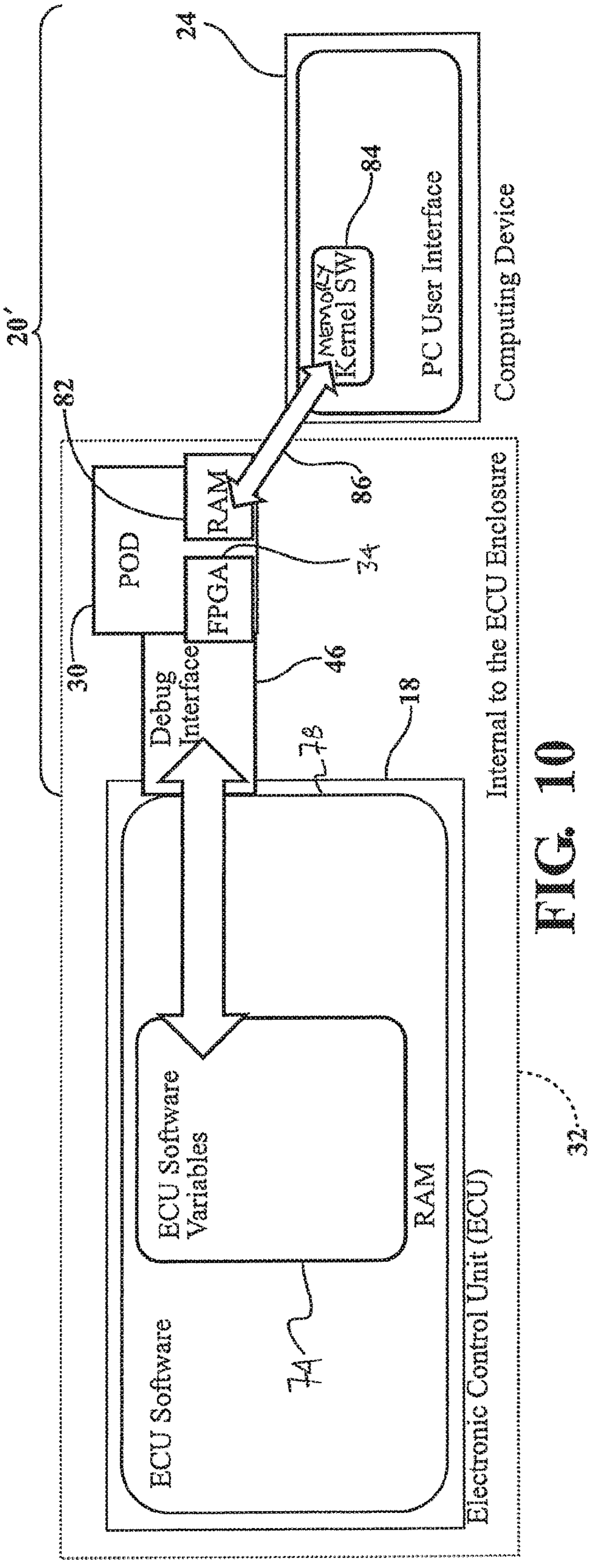
FIG. 10 is a graphic representation of an alternative embodiment of the invention.

In FIG. 10, many of the elements are similar to that of FIGS. 8 and 9, and a discussion of those will not be repeated. However, the calibration tool assembly 20' (also shown in FIG. 2), the POD 30 is shown to have a POD RAM 82. If the POD 30 is equipped with the POD RAM 82, it may connect directly with a computing device 24 when the computing device includes memory 84 that has kernel software resident therein to be able to communicate directly with the POD 30. In such an instance, the hub 26 may not be needed. Therefore, the POD 30 may be connected to a hub 26 (FIGS. 8 and 9) or it may be connected directly to the computing device 24 (FIG. 10), provided the kernel software is resident within the memory 84 of the computing device 24.

The invention has been described in an illustrative manner. It is to be understood that the terminology, which has been used, is intended to be in the nature of words of description rather than of limitation.

Many modifications and variations of the invention are possible in light of the above teachings. Therefore, within the scope of the appended claims, the invention may be practiced other than as specifically described.

We claim:

1. A calibration tool assembly to be operatively connected to a control unit of a vehicle, said calibration tool assembly comprising:

a plug on device electrically connected to the control unit of the vehicle, said plug on device including a field programmable gate array and a debugger port controlled by said field programmable gate array and operatively connected to the control unit of the vehicle, said debugger port bidirectionally transmitting instructions between said field programmable gate array and the control unit for the vehicle to debug and modify instructions for the control unit; and a hub removably connected to said field programmable gate array for receiving all measurement variable data from the control unit through said field programmable gate array for analysis.

2. A calibration tool assembly as set forth in claim 1 wherein said hub includes a logging device for logging all of the measurement variable data received from said field programmable gate array.

3. A calibration tool assembly as set forth in claim 2 wherein said hub includes a converter for converting all of the measurement variable data from a first format to a second format readable by a computer.

4. A calibration tool assembly as set forth in claim 3 wherein said hub includes hub memory to store the measurement variable data received by said field programmable gate array.

5. A calibration tool assembly as set forth in claim 4 wherein said hub memory is selectively removable from said hub.

6. A calibration tool assembly as set forth in claim 5 wherein said debugger interface further includes a primary measurement interface to receive the measurement variable data output by the control unit of the vehicle synchronous with a calculation rate of the measurement variable data.

7. A calibration tool assembly as set forth in claim 1 including a plug on device debugging port to debug, program and download code bidirectionally between said field programmable gate array and a programming tool.

8. A calibration tool assembly as set forth in claim 7 wherein said plug on device debugging port and said debugger port are separate ports.

9. A calibration tool assembly to be operatively connected to a control unit of a vehicle, said calibration tool assembly comprising:

a plug on device electrically connected to the control unit of the vehicle, said plug on device including a field programmable gate array and a debugger port controlled by said field programmable gate array and operatively connected to the control unit of the vehicle, said debugger port bidirectionally transmitting instructions between said field programmable gate array and the control unit for the vehicle to debug and transfer instructions for the control unit; and a hub removably connected to said field programmable gate array for receiving all data from the control unit through said field programmable gate array for analysis.

10. A calibration tool assembly as set forth in claim 9 wherein said hub includes a logging device for logging all of the data received from said field programmable gate array.

11. A calibration tool assembly as set forth in claim 1 wherein said hub includes a converter for converting all of the data from a first format to a second format readable by a computer.

12. A calibration tool assembly to be operatively connected to a control unit of a vehicle, said calibration tool assembly comprising:

a plug on device electrically connected to the control unit of the vehicle, said plug on device including a field programmable gate array and a debugger port controlled by said field programmable gate array and operatively connected to the control unit of the vehicle, said debugger port bidirectionally transmitting instructions between said field programmable gate array and the control unit for the vehicle to debug and transfer instructions for the control unit, said plug on device including a debugging port to debug, program and download code bidirectionally between said field programmable gate array and a programming tool, wherein said plug on device debugging port and said debugger port are separate ports; and a computing device electrically connected to said plug on device adapted to receive all data from the control unit through said field programmable gate array for analysis.

13. A calibration tool assembly as set forth in claim 12 wherein said computing device includes memory for storing data and receiving software to allow said computing device to receive all of the data from the plug on device.

14. A calibration tool assembly as set forth in claim 13 wherein said debugger interface further includes a primary measurement interface to receive the data output by the control unit of the vehicle.

* * * * *